US008689077B2

(12) United States Patent
Klein

(10) Patent No.: US 8,689,077 B2
(45) Date of Patent: *Apr. 1, 2014

(54) MEMORY CONTROLLER METHOD AND SYSTEM COMPENSATING FOR MEMORY CELL DATA LOSSES

(75) Inventor: Dean A. Klein, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 84 days.

This patent is subject to a terminal disclaimer.

(21) Appl. No.: 12/943,830

(22) Filed: Nov. 10, 2010

(65) Prior Publication Data

US 2011/0060961 A1 Mar. 10, 2011

Related U.S. Application Data

(62) Division of application No. 12/235,298, filed on Sep. 22, 2008, now Pat. No. 7,836,374, which is a division of application No. 11/269,248, filed on Nov. 7, 2005, now Pat. No. 7,428,687, which is a division of application No. 10/839,942, filed on May 6, 2004, now Pat. No. 7,099,221.

(51) Int. Cl.
*G11C 29/00* (2006.01)
*H03M 13/00* (2006.01)

(52) U.S. Cl.
USPC ............................ 714/754; 714/773; 714/765

(58) Field of Classification Search
USPC .......................................... 714/754, 773, 765
See application file for complete search history.

(56) References Cited

U.S. PATENT DOCUMENTS

| | | | | | |
|---|---|---|---|---|---|
| 4,006,468 | A | * | 2/1977 | Webster | 365/222 |
| 4,334,295 | A | * | 6/1982 | Nagami | 365/222 |
| 4,380,812 | A | * | 4/1983 | Ziegler et al. | 714/754 |
| 4,433,211 | A | | 2/1984 | McCalmont et al. | 380/36 |
| 4,493,081 | A | * | 1/1985 | Schmidt | 714/754 |
| 4,598,402 | A | | 7/1986 | Matsumoto et al. | 371/38 |
| 4,617,660 | A | * | 10/1986 | Sakamoto | 714/6.2 |
| 4,694,454 | A | * | 9/1987 | Matsuura | 714/6.1 |
| 4,706,249 | A | | 11/1987 | Nakagawa et al. | 371/38 |
| 4,710,934 | A | | 12/1987 | Traynor | 371/38 |

(Continued)

OTHER PUBLICATIONS

Youji Idei et al; "Dual-Period Self-Refresh Scheme for Low-Power DRAM's with On-Chip PROM Mode Register"; IEEE Journal of Solid State Circuits, vol. 33, No. 2, Feb. 1998, pp. 253-259.

(Continued)

*Primary Examiner* — Joseph D Torres
(74) *Attorney, Agent, or Firm* — Dorsey & Whitney LLP

(57) ABSTRACT

A computer system includes a memory controller coupled to a memory module containing several DRAMs. The memory module also includes a non-volatile memory storing row addresses identifying rows containing DRAM memory cells that are likely to lose data during normal refresh of the memory cells. Upon power-up, the data from the non-volatile memory are transferred to a comparator in the memory controller. The comparator compares the row addresses to row addresses from a refresh shadow counter that identify the rows in the DRAMs being refreshed. When a row of memory cells is being refreshed that is located one-half of the rows away from a row that is likely to loose data, the memory controller causes the row that is likely to loose data to be refreshed. The memory controller also includes error checking circuitry for identifying the rows of memory cells that are likely to lose data during refresh.

19 Claims, 8 Drawing Sheets

(56) References Cited

U.S. PATENT DOCUMENTS

| | | | |
|---|---|---|---|
| 4,766,573 A | 8/1988 | Takemae | 365/222 |
| 4,780,875 A | 10/1988 | Sakai | 371/38 |
| 4,858,236 A | 8/1989 | Ogasawara | 371/38 |
| 4,862,463 A | 8/1989 | Chen | 371/38 |
| 4,888,773 A | 12/1989 | Arlington et al. | |
| 4,918,692 A | 4/1990 | Hidaka et al. | 371/2.2 |
| 4,937,830 A | 6/1990 | Kawashima et al. | 371/40.1 |
| 4,958,325 A | 9/1990 | Nakagome et al. | 365/206 |
| 5,012,472 A | 4/1991 | Arimoto et al. | |
| 5,033,026 A | 7/1991 | Tsujimoto | 365/222 |
| 5,056,089 A | 10/1991 | Furuta et al. | 371/3 |
| 5,127,014 A | 6/1992 | Raynham | 371/37.3 |
| 5,172,339 A | 12/1992 | Noguchi et al. | 365/201 |
| 5,208,782 A | 5/1993 | Sakuta et al. | 365/230.03 |
| 5,278,796 A | 1/1994 | Tillinghast et al. | 365/211 |
| 5,291,498 A | 3/1994 | Jackson et al. | 371/40.1 |
| 5,307,356 A | 4/1994 | Fifield | 371/40.1 |
| 5,313,425 A | 5/1994 | Lee et al. | 365/201 |
| 5,313,464 A | 5/1994 | Reiff | 371/2.1 |
| 5,313,475 A | 5/1994 | Cromer et al. | 371/40.1 |
| 5,313,624 A | 5/1994 | Harriman et al. | 395/575 |
| 5,321,661 A | 6/1994 | Iwakiri et al. | 365/222 |
| 5,331,601 A | 7/1994 | Parris | 365/230.08 |
| 5,335,201 A | 8/1994 | Walther et al. | 365/222 |
| 5,369,651 A | 11/1994 | Marisetty | 371/40.1 |
| 5,418,796 A | 5/1995 | Price et al. | 371/39.1 |
| 5,428,630 A | 6/1995 | Weng et al. | 371/40.1 |
| 5,432,802 A | 7/1995 | Tsuboi | 371/40.1 |
| 5,446,695 A | 8/1995 | Douse et al. | 365/222 |
| 5,448,578 A | 9/1995 | Kim | 371/40.4 |
| 5,450,424 A | 9/1995 | Okugaki et al. | 371/40.1 |
| 5,455,801 A | 10/1995 | Blodgett et al. | 365/222 |
| 5,459,742 A | 10/1995 | Cassidy et al. | 371/40.1 |
| 5,481,552 A | 1/1996 | Aldereguia et al. | 371/40.1 |
| 5,509,132 A | 4/1996 | Matsuda et al. | 395/403 |
| 5,513,135 A | 4/1996 | Dell et al. | 365/52 |
| 5,515,333 A | 5/1996 | Fujita et al. | 365/229 |
| 5,588,112 A | 12/1996 | Dearth et al. | 395/182.07 |
| 5,596,521 A | 1/1997 | Tanaka et al. | |
| 5,600,662 A | 2/1997 | Zook | 371/40.1 |
| 5,604,703 A | 2/1997 | Nagashima | 365/200 |
| 5,623,506 A | 4/1997 | Dell et al. | 371/40.1 |
| 5,629,898 A * | 5/1997 | Idei et al. | 365/222 |
| 5,631,914 A | 5/1997 | Kashida et al. | 371/37.4 |
| 5,644,545 A | 7/1997 | Fisch | 365/222 |
| 5,703,823 A | 12/1997 | Douse et al. | 365/222 |
| 5,706,225 A | 1/1998 | Buchenrieder et al. | 365/102 |
| 5,712,861 A * | 1/1998 | Inoue et al. | 714/752 |
| 5,732,092 A | 3/1998 | Shinohara | 371/40.2 |
| 5,740,188 A | 4/1998 | Olarig | 371/40.11 |
| 5,742,554 A | 4/1998 | Fujioka | 365/222 |
| 5,754,753 A | 5/1998 | Smelser | 395/182.06 |
| 5,761,222 A | 6/1998 | Baldi | 371/40.18 |
| 5,765,185 A | 6/1998 | Lambrache et al. | 711/103 |
| 5,784,328 A | 7/1998 | Irrinki et al. | 365/222 |
| 5,784,391 A | 7/1998 | Konigsburg | 371/40.18 |
| 5,808,952 A | 9/1998 | Fung et al. | 365/222 |
| 5,841,418 A | 11/1998 | Bril et al. | 345/3 |
| 5,864,569 A | 1/1999 | Roohparvar | 371/40.18 |
| 5,878,059 A | 3/1999 | Maclellan | 371/40.13 |
| 5,896,404 A | 4/1999 | Kellogg et al. | 371/40.11 |
| 5,909,404 A | 6/1999 | Schwarz | 365/201 |
| 5,912,906 A | 6/1999 | Wu et al. | 371/40.11 |
| 5,953,278 A | 9/1999 | McAdams et al. | 365/219 |
| 5,961,660 A | 10/1999 | Capps, Jr. et al. | 714/763 |
| 5,963,103 A | 10/1999 | Blodgett | 331/75 |
| 6,009,547 A | 12/1999 | Jaquette et al. | 714/758 |
| 6,009,548 A | 12/1999 | Chen et al. | 714/763 |
| 6,018,817 A | 1/2000 | Chen et al. | 714/762 |
| 6,041,001 A | 3/2000 | Estakhri | 365/200 |
| 6,041,430 A | 3/2000 | Yamauchi | 714/752 |
| 6,052,815 A | 4/2000 | Zook | 714/758 |
| 6,052,818 A | 4/2000 | Dell et al. | |
| 6,078,543 A | 6/2000 | Kim | 365/230.03 |
| 6,085,283 A | 7/2000 | Toda | 711/104 |
| 6,085,334 A * | 7/2000 | Giles et al. | 714/6.32 |
| 6,092,231 A | 7/2000 | Sze | 714/758 |
| 6,101,614 A | 8/2000 | Gonzales et al. | 714/6 |
| 6,125,467 A | 9/2000 | Dixon | 714/763 |
| 6,134,167 A | 10/2000 | Atkinson | 365/222 |
| 6,137,739 A | 10/2000 | Kim | 365/205 |
| 6,166,980 A | 12/2000 | Chun | 365/222 |
| 6,178,537 B1 | 1/2001 | Roohparvar | 714/773 |
| 6,199,139 B1 * | 3/2001 | Katayama et al. | 711/106 |
| 6,212,118 B1 * | 4/2001 | Fujita | 365/222 |
| 6,212,631 B1 | 4/2001 | Springer et al. | 713/1 |
| 6,216,246 B1 | 4/2001 | Shau | 714/763 |
| 6,216,247 B1 | 4/2001 | Creta et al. | 714/763 |
| 6,219,807 B1 | 4/2001 | Ebihara et al. | 714/720 |
| 6,223,309 B1 | 4/2001 | Dixon et al. | 714/703 |
| 6,233,717 B1 | 5/2001 | Choi | 714/805 |
| 6,262,925 B1 | 7/2001 | Yamasaki | 365/200 |
| 6,279,072 B1 | 8/2001 | Williams et al. | 711/105 |
| 6,310,825 B1 | 10/2001 | Furuyama | 365/233 |
| 6,324,119 B1 | 11/2001 | Kim | 365/233 |
| 6,349,068 B2 | 2/2002 | Takemae et al. | 365/222 |
| 6,349,390 B1 | 2/2002 | Dell et al. | 714/6 |
| 6,353,910 B1 | 3/2002 | Carnevale et al. | 714/763 |
| 6,397,290 B1 | 5/2002 | Williams et al. | 711/105 |
| 6,397,357 B1 | 5/2002 | Cooper | 714/703 |
| 6,397,365 B1 | 5/2002 | Brewer et al. | 714/766 |
| 6,404,687 B2 | 6/2002 | Yamasaki | 365/222 |
| 6,426,908 B1 | 7/2002 | Kidaka | 365/222 |
| 6,438,066 B1 | 8/2002 | Ooishi et al. | 365/233 |
| 6,442,644 B1 | 8/2002 | Gustavson et al. | 711/105 |
| 6,457,153 B2 | 9/2002 | Yamamoto et al. | 714/763 |
| 6,484,246 B2 | 11/2002 | Tsuchida et al. | 711/169 |
| 6,487,136 B2 | 11/2002 | Hidaka | 365/222 |
| 6,510,537 B1 | 1/2003 | Lee | 714/763 |
| 6,518,595 B2 | 2/2003 | Lee | 257/66 |
| 6,526,537 B2 | 2/2003 | Kishino | 714/763 |
| 6,545,899 B1 * | 4/2003 | Derner et al. | 365/94 |
| 6,549,460 B2 | 4/2003 | Nozoe et al. | 365/185.09 |
| 6,556,497 B2 | 4/2003 | Cowles et al. | 365/222 |
| 6,557,072 B2 | 4/2003 | Osborn | 711/106 |
| 6,560,155 B1 | 5/2003 | Hush | 365/222 |
| 6,570,803 B2 | 5/2003 | Kyung | 365/222 |
| 6,584,543 B2 | 6/2003 | Williams et al. | 711/105 |
| 6,591,394 B2 | 7/2003 | Lee et al. | 714/766 |
| 6,594,796 B1 | 7/2003 | Chiang | 714/800 |
| 6,601,211 B1 | 7/2003 | Norman | 714/773 |
| 6,603,694 B1 | 8/2003 | Frankowsky et al. | 365/222 |
| 6,603,696 B2 | 8/2003 | Janzen | 365/222 |
| 6,603,697 B2 | 8/2003 | Janzen | 365/222 |
| 6,603,698 B2 | 8/2003 | Janzen | 365/222 |
| 6,609,236 B2 | 8/2003 | Watanabe et al. | 716/8 |
| 6,614,698 B2 | 9/2003 | Ryan et al. | 365/189.04 |
| 6,618,281 B1 | 9/2003 | Gordon | 365/49 |
| 6,618,314 B1 | 9/2003 | Fiscus et al. | 365/227 |
| 6,618,319 B2 | 9/2003 | Ooishi et al. | 365/233 |
| 6,628,558 B2 | 9/2003 | Fiscus | 365/222 |
| 6,633,509 B2 | 10/2003 | Scheuerlein et al. | |
| 6,636,444 B2 | 10/2003 | Uchida et al. | 365/189.05 |
| 6,636,446 B2 | 10/2003 | Lee et al. | 365/194 |
| 6,646,942 B2 | 11/2003 | Janzen | 365/222 |
| 6,662,333 B1 | 12/2003 | Zhang et al. | 714/767 |
| 6,665,231 B2 | 12/2003 | Mizuno et al. | 365/233 |
| 6,678,860 B1 | 1/2004 | Lee | 714/763 |
| 6,681,332 B1 | 1/2004 | Byrne et al. | 713/300 |
| 6,697,926 B2 | 2/2004 | Johnson et al. | 711/167 |
| 6,697,992 B2 * | 2/2004 | Ito et al. | 714/763 |
| 6,701,480 B1 | 3/2004 | Karpuszka et al. | 714/764 |
| 6,704,230 B1 | 3/2004 | DeBrosse et al. | 365/201 |
| 6,715,104 B2 | 3/2004 | Imbert de Tremiolles et al. | 714/25 |
| 6,715,116 B2 | 3/2004 | Lester et al. | 714/718 |
| 6,721,223 B2 | 4/2004 | Matsumoto et al. | 365/222 |
| 6,735,726 B2 * | 5/2004 | Muranaka et al. | 714/708 |
| 6,751,143 B2 | 6/2004 | Morgan et al. | 365/222 |
| 6,754,858 B2 | 6/2004 | Borkenhagen et al. | 714/720 |
| 6,775,190 B2 | 8/2004 | Setogawa | 365/193 |
| 6,778,457 B1 | 8/2004 | Burgan | 365/222 |
| 6,781,908 B1 | 8/2004 | Pelley et al. | 365/222 |
| 6,785,837 B1 * | 8/2004 | Kilmer et al. | 714/6.32 |

(56) References Cited

U.S. PATENT DOCUMENTS

| | | | |
|---|---|---|---|
| 6,788,616 B2 | 9/2004 | Takahashi | 365/233 |
| 6,789,209 B1 | 9/2004 | Suzuki et al. | 713/401 |
| 6,792,567 B2 | 9/2004 | Laurent | 714/763 |
| 6,795,362 B2 | 9/2004 | Nakai et al. | 365/222 |
| 6,799,291 B1 * | 9/2004 | Kilmer et al. | 714/722 |
| 6,807,108 B2 | 10/2004 | Maruyama et al. | 365/189.05 |
| 6,810,449 B1 | 10/2004 | Barth et al. | 710/61 |
| 6,819,589 B1 | 11/2004 | Aakjer | 365/185.02 |
| 6,819,624 B2 | 11/2004 | Acharya et al. | 365/233 |
| 6,834,022 B2 | 12/2004 | Derner et al. | 365/222 |
| 6,920,523 B2 | 7/2005 | Le et al. | 711/106 |
| 6,934,199 B2 | 8/2005 | Johnson et al. | 365/194 |
| 6,940,773 B2 | 9/2005 | Poechmueller | 365/222 |
| 6,940,774 B2 | 9/2005 | Perner | 365/222 |
| 6,944,074 B2 | 9/2005 | Chung et al. | 365/200 |
| 6,954,387 B2 | 10/2005 | Kim et al. | |
| 6,965,537 B1 | 11/2005 | Klein et al. | 365/222 |
| 7,002,397 B2 | 2/2006 | Kubo et al. | 327/534 |
| 7,027,337 B2 | 4/2006 | Johnson et al. | 365/194 |
| 7,051,260 B2 | 5/2006 | Ito et al. | 714/754 |
| 7,095,669 B2 * | 8/2006 | Oh | 365/222 |
| 7,096,407 B2 | 8/2006 | Olarig | 714/768 |
| 7,099,221 B2 | 8/2006 | Klein | 365/222 |
| 7,116,602 B2 | 10/2006 | Klein | 365/222 |
| 7,117,420 B1 | 10/2006 | Yeung et al. | 714/763 |
| 7,149,141 B2 | 12/2006 | Johnson et al. | 365/226 |
| 7,167,403 B2 | 1/2007 | Riho et al. | 365/200 |
| 7,171,605 B2 * | 1/2007 | White | 714/763 |
| 7,184,351 B2 | 2/2007 | Ito et al. | 365/222 |
| 7,184,352 B2 | 2/2007 | Klein et al. | 365/222 |
| 7,190,628 B2 | 3/2007 | Choi et al. | 365/222 |
| 7,216,198 B2 | 5/2007 | Ito et al. | 711/106 |
| 7,225,390 B2 | 5/2007 | Ito et al. | 714/777 |
| 7,231,488 B2 | 6/2007 | Poechmueller | 711/106 |
| 7,249,289 B2 | 7/2007 | Muranaka et al. | 714/48 |
| 7,254,067 B2 | 8/2007 | Johnson et al. | 365/194 |
| 7,269,085 B2 | 9/2007 | Sohn et al. | 365/222 |
| 7,272,066 B2 | 9/2007 | Klein | 365/222 |
| 7,272,773 B2 | 9/2007 | Cargnoni et al. | 714/763 |
| 7,277,345 B2 | 10/2007 | Klein | 365/222 |
| 7,280,386 B2 | 10/2007 | Klein | 365/149 |
| 7,317,648 B2 | 1/2008 | Jo | 365/222 |
| 7,318,183 B2 | 1/2008 | Ito et al. | 714/754 |
| 7,340,668 B2 | 3/2008 | Klein | 714/785 |
| 7,372,749 B2 | 5/2008 | Poechmueller | 365/200 |
| 7,428,687 B2 | 9/2008 | Klein | |
| 7,444,577 B2 | 10/2008 | Best et al. | 714/745 |
| 7,453,758 B2 | 11/2008 | Hoffmann | 365/230.04 |
| 7,478,285 B2 | 1/2009 | Fouquet-Lapar | 714/42 |
| 7,493,531 B2 | 2/2009 | Ito et al. | |
| 7,500,171 B2 | 3/2009 | Suzuki | 714/763 |
| 7,526,713 B2 | 4/2009 | Klein | |
| 7,539,926 B1 | 5/2009 | Lesea | |
| 7,558,142 B2 | 7/2009 | Klein | |
| 7,836,374 B2 | 11/2010 | Klein | |
| 7,894,289 B2 | 2/2011 | Pawlowski | |
| 7,900,120 B2 | 3/2011 | Pawlowski et al. | |
| 8,413,007 B2 | 4/2013 | Pawlowski et al. | |
| 2001/0023496 A1 | 9/2001 | Yamamoto et al. | 714/763 |
| 2001/0029592 A1 | 10/2001 | Walker et al. | 714/42 |
| 2001/0044917 A1 | 11/2001 | Lester et al. | 714/718 |
| 2001/0052090 A1 | 12/2001 | Mio | 714/42 |
| 2001/0052102 A1 | 12/2001 | Roohparvar | 714/773 |
| 2002/0013924 A1 | 1/2002 | Yamasoto | 714/763 |
| 2002/0029316 A1 | 3/2002 | Williams et al. | 711/105 |
| 2002/0144210 A1 | 10/2002 | Borkenhagen et al. | 714/805 |
| 2002/0152444 A1 | 10/2002 | Chen et al. | 714/785 |
| 2002/0162069 A1 | 10/2002 | Laurent | 714/763 |
| 2002/0184592 A1 | 12/2002 | Koga et al. | 714/763 |
| 2003/0009721 A1 | 1/2003 | Hsu et al. | 714/773 |
| 2003/0070054 A1 | 4/2003 | Williams et al. | 711/173 |
| 2003/0093744 A1 | 5/2003 | Leung et al. | 714/763 |
| 2003/0097608 A1 | 5/2003 | Rodeheffer et al. | 714/7 |
| 2003/0101405 A1 | 5/2003 | Shibata | 714/763 |
| 2003/0128612 A1 | 7/2003 | Moore et al. | 365/222 |
| 2003/0149855 A1 | 8/2003 | Shibata et al. | 711/200 |
| 2003/0167437 A1 | 9/2003 | DeSota et al. | 714/763 |
| 2003/0191888 A1 | 10/2003 | Klein | 711/105 |
| 2004/0008562 A1 | 1/2004 | Ito et al. | 365/223 |
| 2004/0064646 A1 | 4/2004 | Emerson et al. | 711/131 |
| 2004/0083334 A1 | 4/2004 | Chang et al. | 711/103 |
| 2004/0098654 A1 | 5/2004 | Cheng et al. | 714/758 |
| 2004/0100847 A1 | 5/2004 | Derner et al. | |
| 2004/0117723 A1 | 6/2004 | Foss | 714/805 |
| 2004/0205429 A1 | 10/2004 | Yoshida et al. | 714/718 |
| 2004/0225944 A1 | 11/2004 | Brueggen | 714/758 |
| 2005/0146958 A1 | 7/2005 | Moore et al. | 365/203 |
| 2006/0056259 A1 | 3/2006 | Klein | 365/222 |
| 2006/0056260 A1 | 3/2006 | Klein | 365/222 |
| 2006/0069856 A1 | 3/2006 | Klein | 711/106 |
| 2006/0206769 A1 | 9/2006 | Klein | 714/52 |
| 2006/0218469 A1 | 9/2006 | Klein | 714/763 |
| 2007/0268756 A1 | 11/2007 | Johnson et al. | 365/189.01 |
| 2008/0002503 A1 | 1/2008 | Klein | 365/222 |
| 2008/0092016 A1 | 4/2008 | Pawlowski | 714/764 |
| 2008/0109705 A1 | 5/2008 | Pawlowski et al. | 714/767 |
| 2008/0151671 A1 | 6/2008 | Klein | 365/222 |
| 2009/0024884 A1 | 1/2009 | Klein | 714/718 |
| 2009/0067267 A1 | 3/2009 | Johnson et al. | 365/191 |
| 2010/0054070 A1 | 3/2010 | Klein | |
| 2011/0038217 A1 | 2/2011 | Johnson et al. | |
| 2013/0003467 A1 | 1/2013 | Klein | |

OTHER PUBLICATIONS

Stojko, J. et al., "*Error-Correction Code*", IBM Technical Disclosure Bulletin, vol. 10, No. 10, Mar. 1968.

International Search Report and Written Opinion dated Dec. 15, 2006 of Application No. PCT/2005/24322.

\* cited by examiner

US 8,689,077 B2

MEMORY CONTROLLER METHOD AND SYSTEM COMPENSATING FOR MEMORY CELL DATA LOSSES

CROSS-REFERENCE TO RELATED APPLICATIONS

This application is a divisional of U.S. patent application Ser. No. 12/235,298, filed Sep. 22, 2008, which is a divisional of U.S. patent application Ser. No. 11/269,248, filed Nov. 7, 2005, U.S. Pat. No. 7,428,687, which is a divisional of U.S. patent application Ser. No. 10/839,942, filed May 6, 2004, U.S. Pat. No. 7,099,221. These applications and patents incorporated by reference herein in their entirety and for all purposes.

TECHNICAL FIELD

This invention relates to dynamic random access memory ("DRAM") devices and controllers for such memory device, and, more particularly, to a method and system for controlling the operation of a memory controller, a memory module or a DRAM to manage the rate at which data bits stored in the DRAM are lost during refresh.

BACKGROUND OF THE INVENTION

As the use of electronic devices, such as personal computers, continue to increase, it is becoming ever more important to make such devices portable. The usefulness of portable electronic devices, such as notebook computers, is limited by the limited length of time batteries are capable of powering the device before needing to be recharged. This problem has been addressed by attempts to increase battery life and attempts to reduce the rate at which such electronic devices consume power.

Various techniques have been used to reduce power consumption in electronic devices, the nature of which often depends upon the type of power consuming electronic circuits that are in the device. For example, electronic devices, such a notebook computers, typically include dynamic random access memory ("DRAM") devices that consume a substantial amount of power. As the data storage capacity and operating speeds of DRAM devices continues to increase, the power consumed by such devices has continued to increase in a corresponding manner.

In general, the power consumed by a DRAM increases with both the capacity and the operating speed of the DRAM devices. The power consumed by DRAM devices is also affected by their operating mode. A DRAM, for example, will generally consume a relatively large amount of power when the memory cells of the DRAM are being refreshed. As is well-known in the art, DRAM memory cells, each of which essentially consists of a capacitor, must be periodically refreshed to retain data stored in the DRAM device. Refresh is typically performed by essentially reading data bits from the memory cells in each row of a memory cell array and then writing those same data bits back to the same cells in the row. A relatively large amount of power is consumed when refreshing a DRAM because rows of memory cells in a memory cell array are being actuated in the rapid sequence. Each time a row of memory cells is actuated, a pair of digit lines for each memory cell are switched to complementary voltages and then equilibrated. As a result, DRAM refreshes tends to be particularly power-hungry operations. Further, since refreshing memory cells must be accomplished even when the DRAM is not being used and is thus inactive, the amount of power consumed by refresh is a critical determinant of the amount of power consumed by the DRAM over an extended period. Thus many attempts to reduce power consumption in DRAM devices have focused on reducing the rate at which power is consumed during refresh.

Refresh power can, of course, be reduced by reducing the rate at which the memory cells in a DRAM are being refreshed. However, reducing the refresh rate increases the risk of data stored in the DRAM memory cells being lost. More specifically, since, as mentioned above, DRAM memory cells are essentially capacitors, charge inherently leaks from the memory cell capacitors, which can change the value of a data bit stored in the memory cell over time. However, current leaks from capacitors at varying rates. Some capacitors are essentially short-circuited and are thus incapable of storing charge indicative of a data bit. These defective memory cells can be detected during production testing, and can then be repaired by substituting non-defective memory cells using conventional redundancy circuitry. On the other hand, current leaks from most DRAM memory cells at much slower rates that span a wide range. A DRAM refresh rate is chosen to ensure that all but a few memory cells can store data bits without data loss. This refresh rate is typically once every 64 ms. The memory cells that cannot reliably retain data bits at this refresh rate are detected during production testing and replaced by redundant memory cells. However, the rate of current leakage from DRAM memory cells can change after production testing, both as a matter of time and from subsequent production steps, such as in packaging DRAM chips. Current leakage, and hence the rate of data loss, can also be effected by environmental factors, such as the temperature of DRAM devices. Therefore, despite production testing, a few memory cells will typically be unable to retain stored data bits at normal refresh rates.

One technique that has been used to reduce prevent data errors during refresh is to generate an error correcting code "ECC" from each item of stored data, and then store the ECC along with the data. A computer system 10 employing typical ECC techniques is shown in FIG. 1. The computer system 10 includes a central processor unit ("CPU") 14 coupled to a system controller 16 through a processor bus 18. The system controller 16 is coupled to input/output ("I/O") devices (not shown) through a peripheral bus 20 and to an I/O controller 24 through an expansion bus 26. The I/O controller 24 is also connected to various peripheral devices (not shown) through an I/O bus 28.

The system controller 16 includes a memory controller 30 that is coupled to several memory modules 32a-c through an address bus 36, a control bus 38, a syndrome bus 40, and a data bus 42. Each of the memory modules 32a-c includes several DRAM devices (not shown) that store data and an ECC. The data are coupled through the data bus 42 to and from the memory controller 30 and locations in the DRAM devices mounted on the modules 32a-c. The locations in the DRAM devices to which data are written and data are read are designated by addresses coupled to the memory modules 32a-c on the address bus 36. The operation of the DRAM devices in the memory modules 32a-c are controlled by control signals coupled to the memory modules 32a-c on the control bus 38.

In operation, when data are to be written to the DRAM devices in the memory modules 32a-c, the memory controller 30 generates an ECC, and then couples the ECC and the write data to the memory modules 32a-c through the syndrome bus 40 and the data bus 42, respectively, along with control signals coupled through the control bus 38, and a memory address coupled through the address bus 36. When the store data are to be read from the DRAM devices in the memory modules 32a-c, the memory controller 30 applies to the memory modules 32a-c control signals through the control bus 38 and a memory address 36 through the address bus. Read data and the corresponding syndrome are then coupled from the memory modules 32a-c to the memory controller 30 through the data bus 42 and syndrome bus 40, respectively. The memory controller 30 then uses the ECC to determine if any bits of the read data are in error, and, if not too many bits are in error, to correct the read data.

One example of a conventional memory controller 50 is shown in FIG. 2. The operation of the memory controller 50 is controlled by a memory control state machine 54, which outputs control signals on the control bus 38. The state machine 54 also outputs a control signal to an address multiplexer 56 that outputs an address on the address bus 36. The most significant or upper bits of an address are coupled to a first port the multiplexer 56 on an upper address bus 60, and the least significant or lower bits of an address are coupled to a second port of the multiplexer 56 on a lower address bus 62. The upper and lower address buses 60, 62, respectively are coupled to an address bus 18A portion of the processor bus 18 (FIG. 1).

A data bus portion 18D of the processor bus 18 on which write data are coupled is connected to a buffer/transceiver 70 and to an ECC generator 72. A data bus portion 18D' on which read data are coupled is connected to an ECC check/correct circuit 74. In practice, both data bus portions 18D and 18D' comprise a common portion of the processor bus 18, but they are illustrated as being separate in FIG. 2 for purposes of clarity. The ECC generator 72 generates an ECC from the write data on bus 18D, and couples the syndrome to the buffer transceiver through an internal ECC syndrome bus 74. The ECC check/correct circuit 76 receives read data from the buffer transceiver 70 through an internal read bus 78 and a syndrome through an internal ECC syndrome bus 80. The buffer/transceiver 70 applies the syndrome received from the ECC generator 72 to the memory modules 32a-c (FIG. 1) through the syndrome bus 40. The buffer/transceiver 70 couples the syndrome to the memory modules 32a-c along with the write data, which are coupled through the data bus 42. The buffer/transceiver 70 also couples read data from the data bus 42 and a syndrome from the syndrome bus 40 to the ECC check/correct circuit 76. The ECC check/correct circuit 76 then determines whether or not any of the bits of the read data are in error. If the ECC's check/correct circuit 76 determines that any of the bits of the read data are in error, it corrects those bits as long as a sufficiently low number of bits are in error that they can be corrected. As is well-known in the art, the number of bits in the syndrome determines the number of bits of data that can be corrected. The uncorrected read data, if no error was detected, or the corrected read data, if an error was detected, are then coupled through the data bus 18D'. In the event a correctable error was found, the ECC check/correct circuit 76 generates a read error R_ERROR signal, which is coupled to the memory control state machine 54. If, however, too many bits of the read data were in error to be corrected, the ECC check/correct circuit 76 generates a fatal error F_ERROR signal, which is coupled to the CPU 14 (FIG. 1).

The memory controller 50 also includes a refresh timer 84 that schedules a refresh of the DRAM devices in the memory modules 32a-c at a suitable rate, such as once every 64 ms. The refresh timer 84 periodically outputs a refresh trigger signal on line 88 that causes the memory control state machine 54 to issue an auto refresh command on the control bus 38.

The use of ECCs in the memory controller 50 shown in FIG. 2 can significantly improve the reliability of data stored in the DRAM devices in the memory modules 32a-c. Furthermore, the refresh timer 84 can cause the DRAMs to be refreshed at a slower refresh rate since resulting data bit errors can be corrected. The use of a slower refresh rate can provide the significant advantage of reducing the power consumed by the DRAM. However, the use of ECCs requires that a significant portion of the DRAM storage capacity be used to store the ECCs, thus effectively reducing the storage capacity of the DRAM. Further, the use of ECCs can reduce the rate at the DRAM can be refreshed because the ECC must be used to check and possibly correct each item of data read from the DRAM during refresh. Furthermore, the need to perform ECC processing on read data all during refresh can consume a significant amount of power. Also, if the ECCs are not used during normal operation, it is necessary to refresh the DRAM array at the normal refresh rate while checking the entire array for data errors and correcting any errors that are found before switching to the normal operating mode.

There is therefore a need for a method and system that eliminates or corrects data storage errors produced during refresh of a DRAM either without the use of ECCs or without the need to repetitively correct data errors with ECCs.

DETAILED DESCRIPTION

Figure 1:
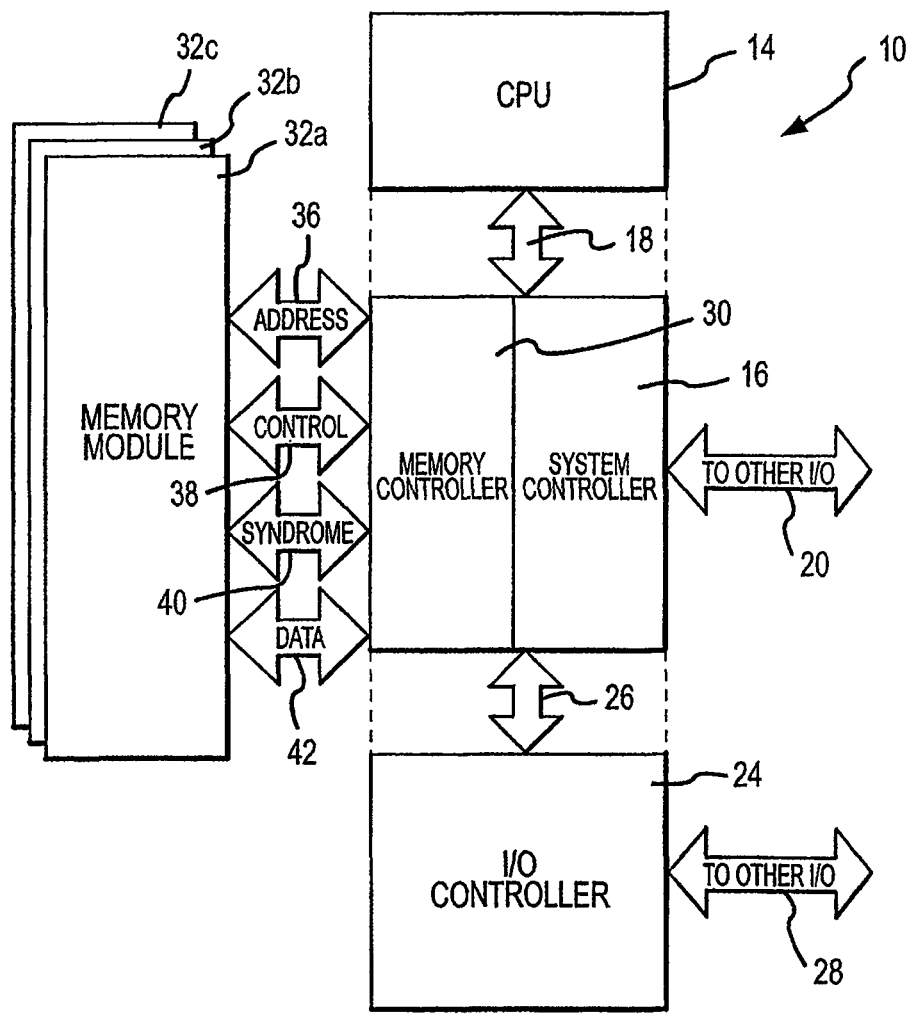
FIG. 1 is a block diagram of a conventional computer system.
Figure 3:
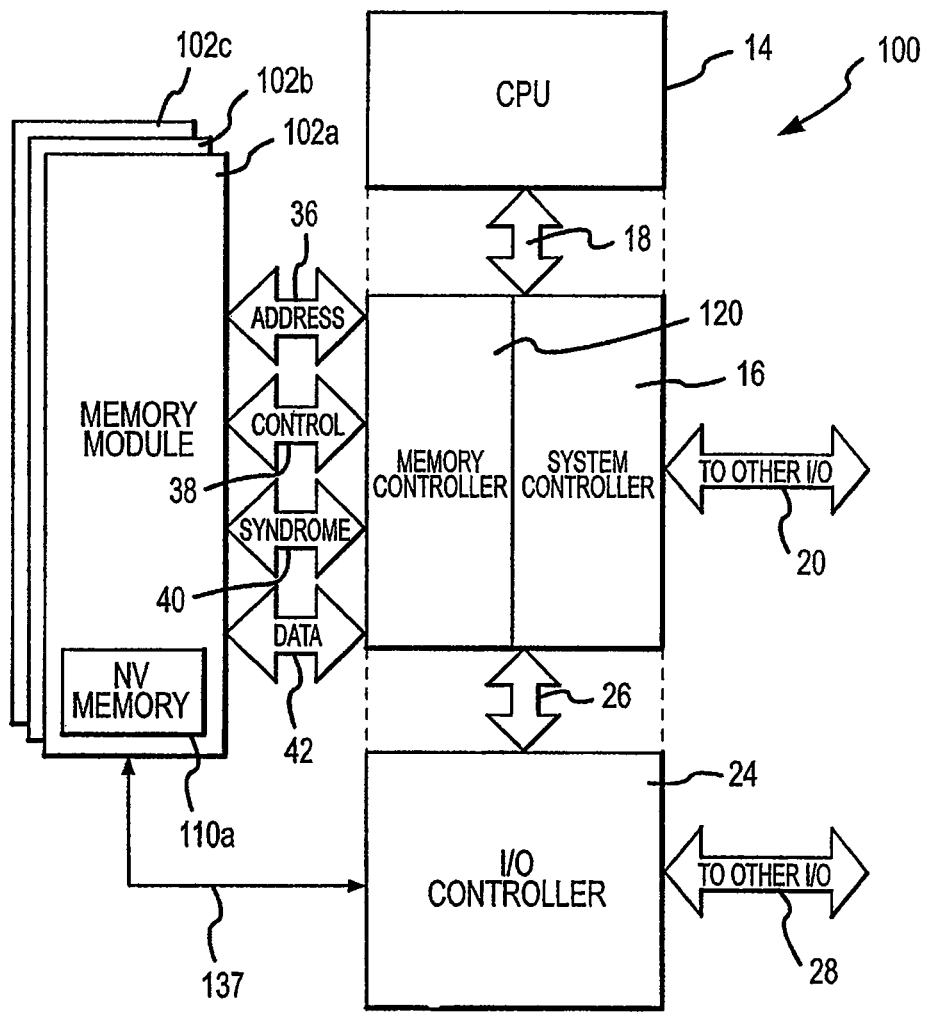
FIG. 3 is a block diagram of a computer system according to one embodiment of the invention.

One embodiment of a computer system 100 according to one embodiment of the invention is shown in FIG. 3. The computer system 100 uses many of the same components that are used in the conventional computer system 10 of FIG. 1. Therefore, in the interest of brevity, these components have been provided with the same reference numerals, and an explanation of their operation will not be repeated. The computer system 100 of FIG. 3 differs from the computer system 10 of FIG. 1 by including memory modules 102a-c that each include a non-volatile memory 110a-c, respectively (only 110a is shown in FIG. 3). The non-volatile memories 110a-c store row addresses identifying rows containing one or more memory cells in the DRAM devices in the respective modules 102*a-c* that are prone to errors because they discharge at a relatively high rate. The computer system 100 also differs from the computer system 10 of FIG. 1 by including circuitry that detects and identifies these error-prone memory cells and subsequently takes protective action. More specifically, as described in greater detail below, a memory controller 120 in the computer system 100 uses ECC techniques to determine which memory cells are error-prone during refresh. Once these error-prone memory cells have been identified, the memory controller 120 inserts additional refreshes for the rows containing these memory cells. As a result, this more rapid refresh is performed only on the rows containing memory cells that need to be refreshed at a more rapid rate so that power is not wasted refreshing memory cells that do not need to be refreshed at a more rapid rate.

Figure 2:
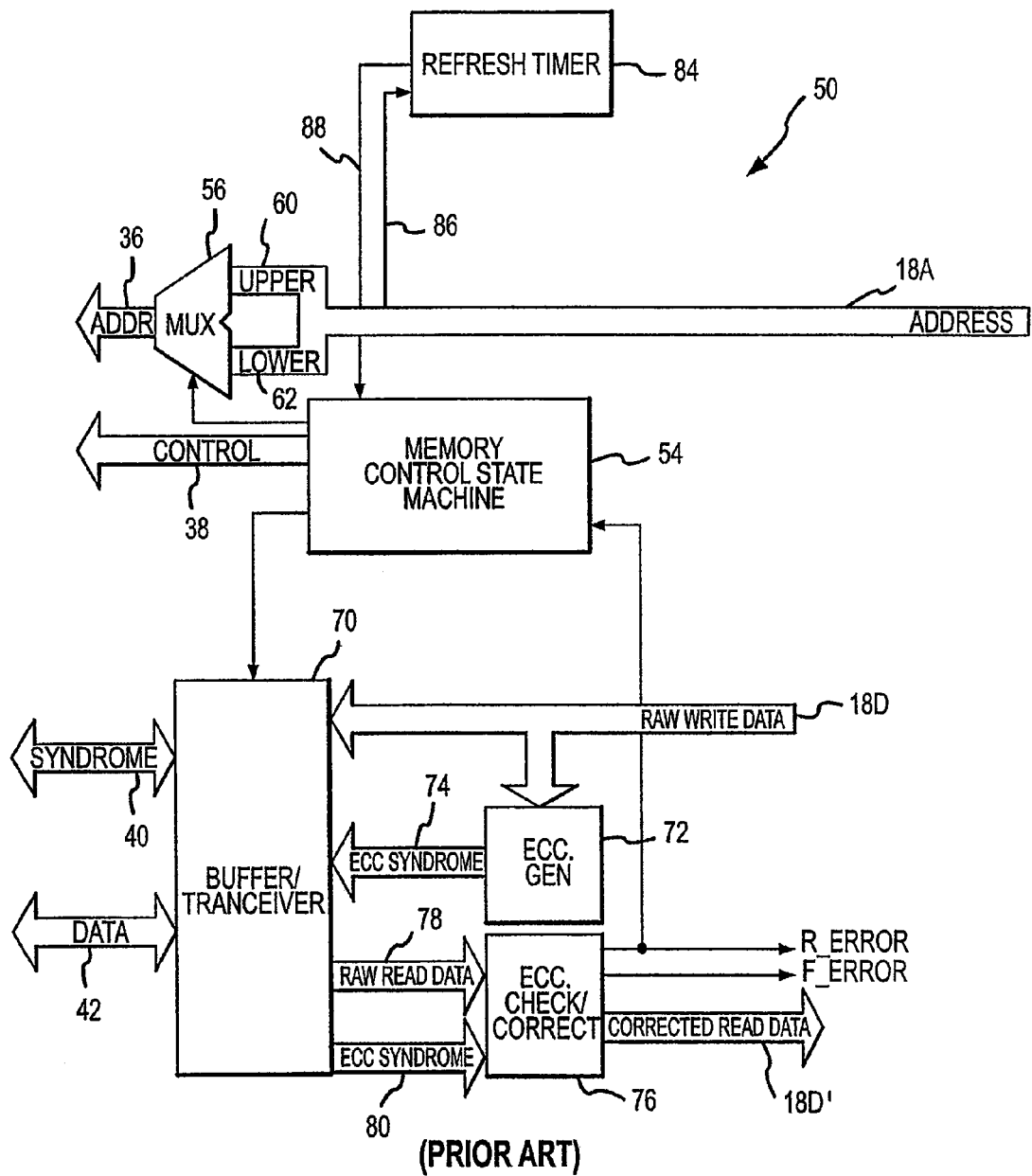
FIG. 2 is a block diagram of a conventional memory controller that may be used in the computer system of FIG. 1.
Figure 4:
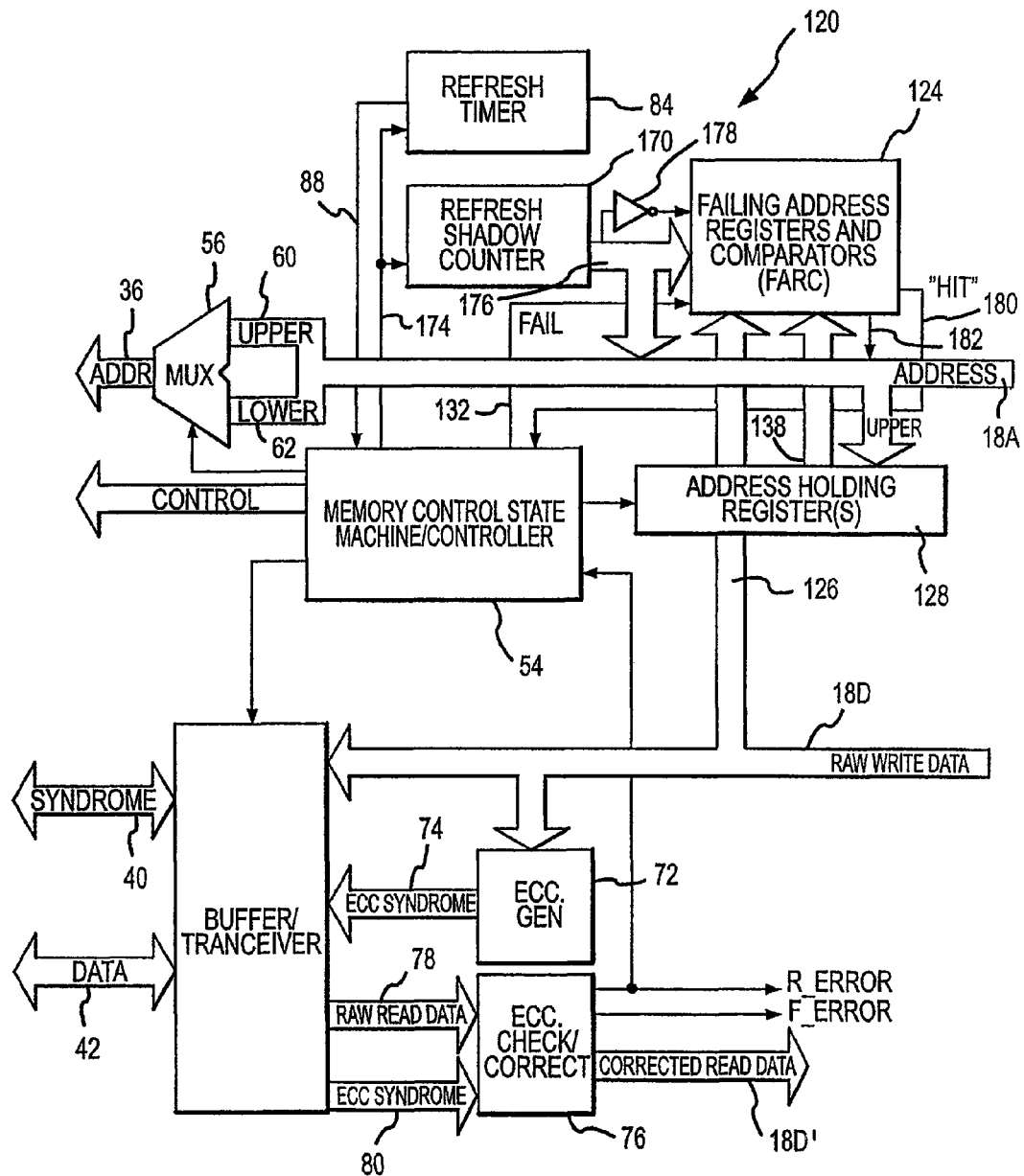
FIG. 4 is a block diagram of a memory controller according to one embodiment of the invention that may be used in the computer system of FIG. 3.

One embodiment of the memory controller 120 that is used in the computer system 100 is shown in FIG. 4. The memory controller 120 uses many of the same components that are used in the conventional memory controller 50 of FIG. 2. Again, in the interest of brevity, these components have been provided with the same reference numerals, and an explanation of their operation will not be repeated except to the extent that they perform different or additional functions in the memory controller 120. In addition to the components included in the memory controller 50, the memory controller 120 includes a failing address register and comparator unit ("FARC") 124 that stores the row addresses containing error-prone memory cells requiring refreshes at a more rapid rate. The FARC 124 is coupled to the raw write data bus 18D to receive from the CPU 14 (FIG. 3) the row addresses that are stored in the non-volatile memories 110*a-c* (FIG. 3). At power-up of the computer system 100, the CPU 14 performs a process 130 to either transfer the row addresses from the non-volatile memories 110*a-c* to the FARC 124 as shown in the flow-chart of FIG. 5 or to test the DRAMs in the memory modules 102*a-c* to determine which rows contain at least one error-prone memory cell and then program the non-volatile memories 110*a-c* and the FARC, as shown in the flow-chart of FIG. 6.

Figures 5, 6:
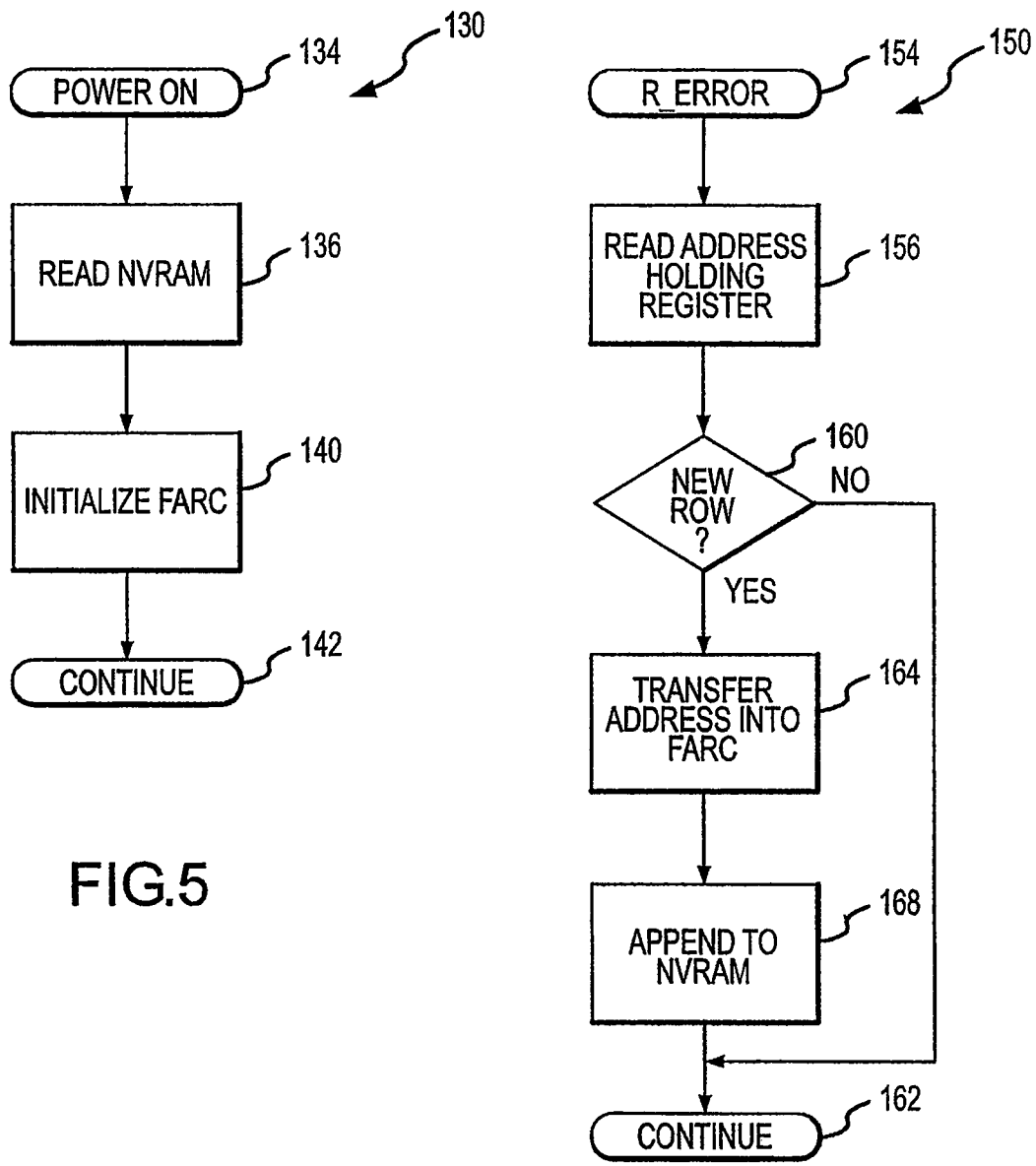
FIG. 5 is a flow chart showing a procedure for transferring error-prone row addresses from a memory module to the memory controller of FIG. 4 and for storing the error-prone row addresses in the memory controller.
FIG. 6 is a flow chart showing a procedure identifying error-prone row addresses and for storing information about the error-prone row addresses in a memory module.

With reference, first, to FIG. 5, the process 130 is entered during power-on at step 134. The non-volatile memories 110*a-c* are then read at 136 by the CPU 14 coupling read addresses to the non-volatile memories 110*a-c* and the I/O controller coupling control signals to the non-volatile memories 110*a-c* through line 137. The FARC 124 is then initialized at 140 before continuing at 142 by the CPU 14 coupling the row addresses through the raw write data bus 18D and the data bus 126.

In the event row addresses have not yet been stored in the non-volatile memories 110*a-c*, the memory controller 120 may determine which rows contain error-prone memory cells and program the non-volatile memories 110*a-c* with the addresses of such rows. The non-volatile memories 110*a-c* are initially programmed by the CPU 14 writing data to the DRAMs in the memory modules 110*a-c* and then reading the stored data from the DRAMs after the DRAMs have been refreshed over a period. Any errors that have arisen as a result of excessive discharge of memory cells during the refresh are detected by the ECC check/correct circuit 76. As the DRAMs are read, the row addresses coupled to the DRAMs through the address bus 18A are stored in address holding registers 128 and coupled to the FARC 124. If the read data are in error, the ECC check/correct circuit 76 outputs an R_ERROR that is coupled through line 148 to the memory control state machine 54. The memory control state machine 54 then processes the R_ERROR signal using the process 150 shown in FIG. 6. The process is initiated by the memory control state machine 54 upon receipt of the R_ERROR signal at step 154. The address holding register 128 is then read at 156, and a determination is made at 160 whether the row responsible for the R_ERROR signal being generated is a new row in which an error-prone memory cells previously not been detected. If an error-prone memory cells was previously detected, the row address being output from the read address holding register 128 has already been recorded for extra refreshes. The process 150 can therefore progress direction to the final continue step 162 without the need for further action.

If an error-prone memory cells had previously not been detected in the current row, the row address being output from the address holding register 128 is transferred to the FARC 124 at step 164. This is accomplished by the memory control state machine 54 outputting a "FAIL" signal on line 132 that causes the FARC 124 to store the current row address, which is output from the address holding registers 128 on bus 138. The address is also appended at step 168 to the non-volatile memory 110 in the memory module 102*a-c* containing the DRAM having the error-prone memory cell. This is accomplished by coupling data identifying the row addresses containing error-prone memory cells to the raw write data bus 18D. The data identifying the row addresses are then coupled to the memory modules 102*a-c* for storage in the non-volatile memories 110*a-c*.

Once either the process 130 of FIG. 5 or the process 150 of FIG. 6 has been completed for all rows, the row addresses identifying rows containing one or more error-prone memory cells have been stored in the FARC 124. The memory controller 120 is then ready to insert extra refreshes of such rows. As is well known in the art, when an auto-refresh command is issued to a DRAM, an internal refresh counter in the DRAM generates row addresses that are used to select the rows being refreshed. However, since these row addresses are not coupled from the DRAMs to the memory controller 120, the address of each row being refreshed must be determined in the memory controller 120. This is accomplished by using a refresh shadow counter 170 to generate refresh row addresses in the same that the refresh counter in the DRAMs generate such addresses. Furthermore, for the memory controller 120, the addresses that are used for refreshing the memory cells in the DRAMs are generated by the memory controller 120. When the memory control state machine 54 issues an auto-refresh command to a DRAM, it outputs a trigger signal on line 174 that resets the refresh shadow counter 170 and the refresh timer 84 and causes the refresh shadow counter 170 to begin outputting incrementally increasing row addresses. These incrementally increasing row addresses are coupled to the DRAMs via the address bus 18A, and they are also coupled to the FARC 124 via bus 176. However, the most significant bit ("MSB") of the row address is applied to an inverter 178 so that the FARC 124 receives a row address that is offset from the current row address by one-half the number of rows in the DRAMs. This offset row address is compared to the addresses of the rows containing error-prone memory cell(s) that are stored in the FARC 124. In the event of a match, the FARC 124 outputs a HIT signal on line 180.

The memory control state machine 54 responds to the HIT signal by inserting an extra refresh of the row identified by the offset address. For this purpose, the address bus 18A receives all but the most significant bit of the row address from the refresh shadow counter 170 and the most significant bit from the FARC 124 on line 182. As a result, the row identified by the offset is refreshed twice as often as other rows, i.e., once when the address is output from the refresh shadow counter 170 and once when the row address offset from the address by one-half the number of rows is output from the refresh shadow counter 170.

Figure 7:
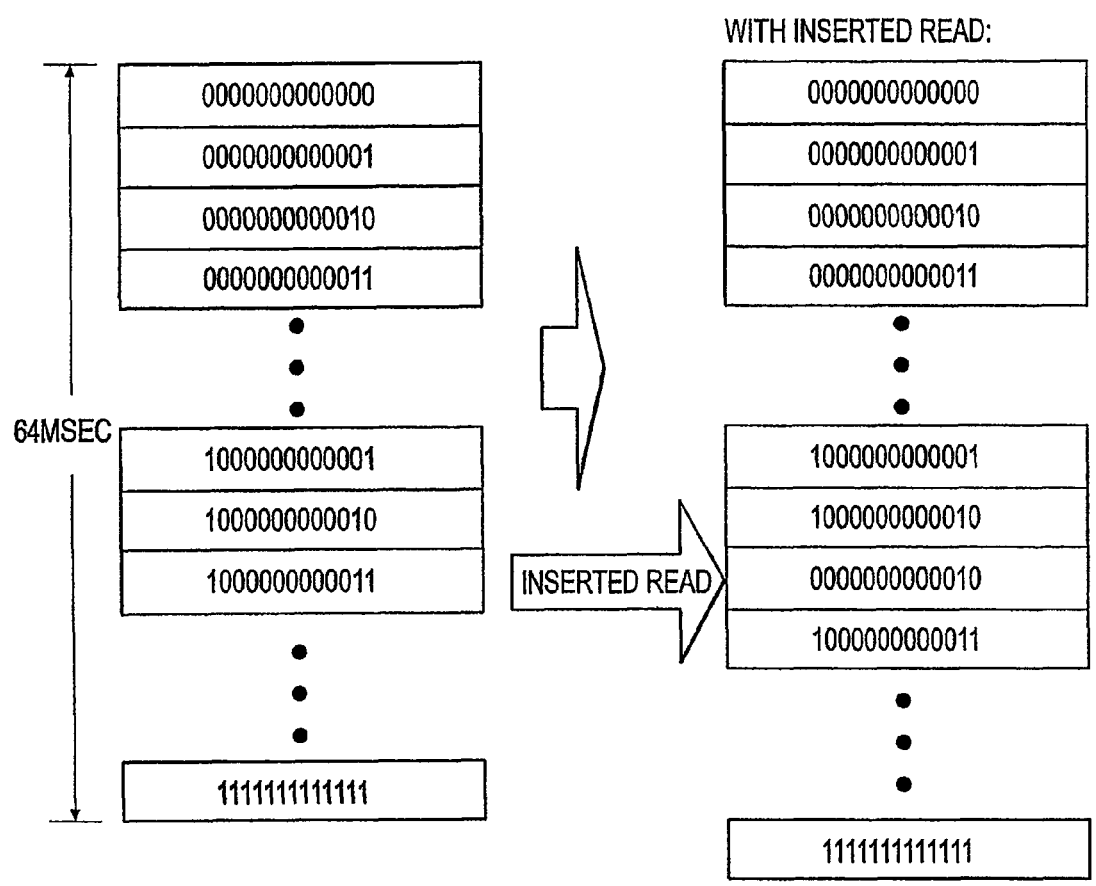
FIG. 7 is a schematic diagram illustrating the manner in which the memory controller of FIG. 3 may insert extra refreshes of rows containing at least one error-prone memory cell.

The manner in which extra refreshes of rows occurs will be apparent with reference to FIG. 7, which shows the output of the refresh shadow counter 170 (FIG. 4) on the left hand side and the addresses of the rows actually being refreshed on the right hand side. Every 64 ms, the refresh shadow counter 170 outputs row addresses that increment from "0000000000000" to "1111111111111." For purposes of illustration, assume that row "0000000000010" contains one or more error-prone memory cells. This row will be refreshed in normal course when the refresh shadow counter 170 outputs "0000000000010" on the third count of the counter 170. When the refresh shadow counter 170 has counted three counts past one-half of the rows, it outputs count "1000000000010." However, the MSB is inverted by the inverter 178 so that the FARC 124 receives a count of "0000000000010." Since this count corresponds to an address for a row containing one or more error-prone memory cells, a refresh of row "0000000000010" is inserted between row "1000000000010" and row "1000000000011," as shown on the right hand side of FIG. 7.

Although the memory controller 120 refreshes rows containing one or more error-prone memory cells twice as often as other rows, it may alternatively refresh rows containing error-prone memory cells more frequently. This can be accomplished by inverting the MSB and the next to MSB ("NTMSB") of the row address coupled from the refresh shadow counter 170 to the FARC 124. A row would then be refreshed when the refresh shadow counter 170 outputs its address, when the refresh shadow counter 170 outputs its address with the NTMSB inverted, when the refresh shadow counter 170 outputs its address with the MSB inverted, and when the refresh shadow counter 170 outputs its address with both the MSB and the NTMSB inverted. Other variations will be apparent to one skilled in the art.

Figure 8:
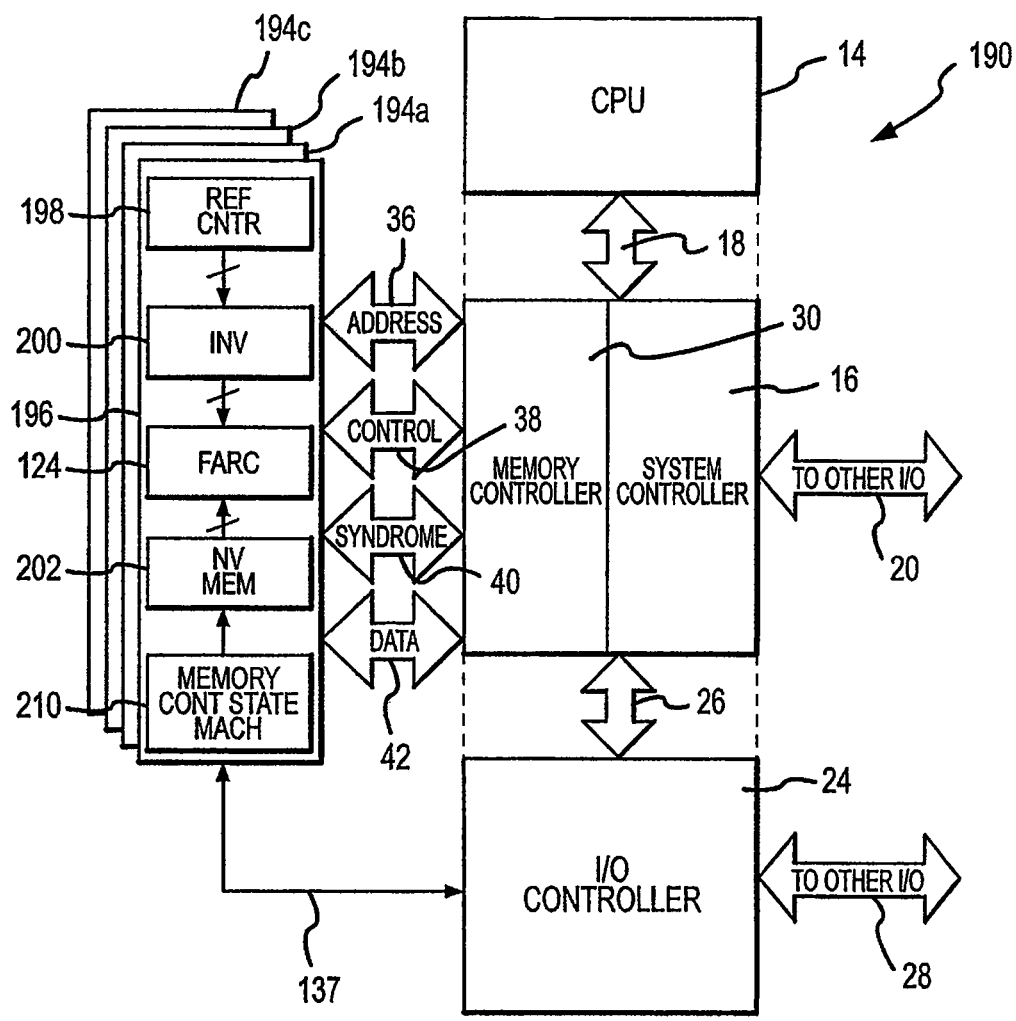
FIG. 8 is a block diagram of a computer system according to another embodiment of the invention.

A computer system 190 according to another embodiment of the invention is shown in FIG. 8. In this embodiment, the computer system 190 includes the conventional memory controller 30 of FIG. 1 coupled to memory modules 194a-c. Each of the memory modules 194a-c includes several DRAMs 196, although only one DRAM is shown in FIG. 8. The DRAM 196 includes the FARC 124, which is coupled to a refresh counter 198 through inverting circuitry 200. The FARC 124 is initialized with data stored in a non-volatile memory 202 that identifies the addresses of the rows containing one or more error-prone memory cells. The non-volatile memory 202 is initially programmed in the same manner that the non-volatile memory was programmed, as explained above, using ECC circuitry 204. The inverting circuitry 200 inverts appropriate bits of refresh addresses generated by the refresh counter 198 to schedule extra refreshes of rows containing one or more error-prone memory cells. The DRAM 196 also includes a memory control state machine 210 that controls the operation of the above-described components.

Figure 9:
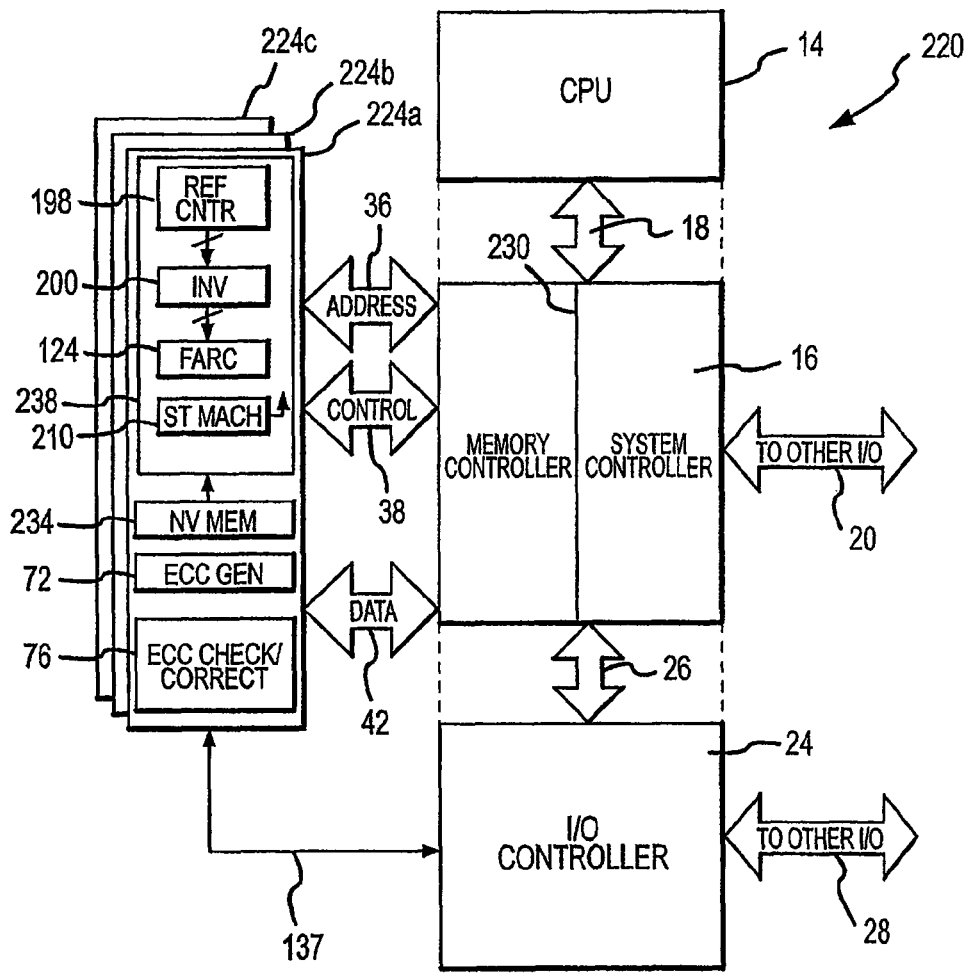
FIG. 9 is a block diagram of a computer system according to still another embodiment of the invention.

A computer system 220 according to another embodiment of the invention is shown in FIG. 9. This embodiment includes several memory modules 224a-c coupled to a memory controller 230. The memory modules 224a-c each include the ECC generator 72 and ECC check/correct circuit 76 of FIGS. 2 and 3 as well as the other components that are used to determine which rows contain one or more error-prone memory cells. The computer system 220 does not include a syndrome bus 40, of course, since the ECC syndromes are generated in the memory modules 224a-c. However, once the memory modules 224a-c have determined the address of rows containing one or more error-prone memory cells, it programs a non-volatile memory device 234 in each of the memory modules 224a-c with those addresses. DRAMs 238 each include the FARC 124, the refresh counter 198, the inverting circuitry 200, and the memory control state machine 210 of FIG. 8 to schedule extra refreshed of rows containing one or more error-prone memory cell, as previously explained.

Although the component of the various embodiments have been explained as being in either a memory controller, a memory module or a DRAM, it will be understood that there is substantial flexibility in the location of many components. For example, the FARC 124 may be either in the memory controller as shown in FIG. 4, the DRAMs as shown in FIGS. 8 and 9, or in the memory modules separate from the DRAMs. Furthermore, although the present invention has been described with reference to the disclosed embodiments, persons skilled in the art will recognize that changes may be made in form and detail without departing from the spirit and scope of the invention.

I claim:

1. An apparatus for refreshing memory cells in a memory that may have relatively short data retention times, the apparatus comprising:

an ECC generator located in a memory controller, the ECC generator coupled to receive write data from a memory module having the memory and to generate respective ECC syndrome bits corresponding to the write data;

a storage device located in the memory module;

an ECC checker located in the memory controller, the ECC checker coupled to receive read data from the memory module along with corresponding stored ECC syndrome bits, the ECC checker being operable to detect if the read data are in error based on the ECC syndrome bits corresponding to the read data, the ECC checker being operable to output an error signal responsive to detecting a read data error;

a refresh shadow counter located in the memory controller, the refresh counter being operable to generate row addresses that are provided to the memory for refreshing rows of the memory cells, wherein the refresh shadow counter is configured to shadow a refresh counter in the memory;

a memory control state machine located in the memory controller, the memory control state machine coupled to receive the error signal from the ECC checker and being operable to cause to be stored in the storage device the respective addresses corresponding to memory cells from which the erroneous read data was read, the memory control state machine further being operable to issue refresh commands to the memory and control the refresh shadow counter to provide the row addresses to the memory for refreshing rows of memory, wherein a refresh command issued by the memory control state machine comprises a command to insert a refresh command to a row address identified by the refresh shadow counter; and a refresh circuit coupled to the storage device and being operable to refresh rows of the memory cells corresponding to the respective addresses stored in the storage device more frequently than the rate which other rows of memory cells are refreshed.

2. The apparatus of claim 1, further comprising:

a failing address comparator located in the memory controller, the failing address comparator being operable to receive from the storage device addresses corresponding to memory cells from which the erroneous read data was read, the failing address comparator being coupled to the refresh shadow counter to receive the row address from the refresh shadow counter, the failing address comparator being operable to compare the row address from the refresh shadow counter to the address from the storage device and to generate an indicating signal responsive to a predetermined relationship between the row address from the refresh shadow counter and one of the addresses from the storage device.

3. The apparatus of claim 2, wherein the failing address comparator is operable to invert at least one of the bits of the row address received from the refresh shadow counter to provide a comparison row address, the failing address comparator further being operable to generate the indicating signal responsive to a match between the comparison row address and one of the stored row addresses.

4. The apparatus of claim 1, wherein the storage device comprises a non-volatile memory device located in the memory module.

5. The apparatus of claim 1, wherein the memory module comprises a plurality of volatile memory devices.

6. The apparatus of claim 5, wherein the volatile memory devices comprise respective dynamic random access memory devices.

7. The apparatus of claim 1, further comprising a refresh timer in the memory controller, the refresh timer being couples to the memory control state machine and being operable to periodically generate a trigger signal that causes the memory control state machine to output command signals corresponding to an auto-refresh command.

8. The apparatus of claim 1, wherein the memory control state machine is operable to output command signals adapted to cause the storage device to store the respective addresses corresponding to memory cells from which the erroneous read data was read.

9. An apparatus refreshing memory cells in a memory that may have relatively short data retention times, the apparatus comprising:
an ECC generator located in a memory module, the ECC generator coupled to receive write data from a memory device in the memory module and to generate respective ECC syndrome bits corresponding to the write data;
a memory located in the memory module;
a storage device located in the memory module;
an ECC checker located in the memory module, the ECC checker coupled to receive read data from the memory device along with corresponding stored ECC syndrome bits, the ECC checker being operable to detect if the read data are in error based on the ECC syndrome bits corresponding to the read data, the ECC checker being operable to output an error signal responsive to detecting a read data error;
a refresh shadow counter located in a memory controller, the refresh shadow counter being operable to generate row addresses that are provided to the memory for refreshing rows of the memory cells, wherein the refresh shadow counter is configured to shadow a refresh counter in the memory;
a memory control state machine located in the memory module, the memory control state machine coupled to receive the error signal from the ECC checker and being operable to cause to be stored in the storage device the respective addresses corresponding to memory cells from which the erroneous read data was read, the memory control state machine further being operable to issue refresh commands to the memory and control the refresh shadow counter to provide the row addresses to the memory for refreshing rows of memory, wherein a refresh command issued by the memory control state machine comprises a command to insert a refresh command to a row address identified by the refresh shadow counter; and
a refresh circuit coupled to the storage device and being operable to refresh rows of the memory cells corresponding to the respective addresses stored in the storage device more frequently than the rate at which other rows of memory cells are refreshed.

10. The apparatus of claim 9, further comprising:
a failing address comparator located in the memory module, the failing address comparator being operable to receive from the storage device addresses corresponding to memory cells from which the erroneous read data was read, the failing address comparator being coupled to the refresh shadow counter to receive the row address from the refresh shadow counter, the failing address comparator being operable to compare the row address from the refresh shadow counter to the address from the storage device and to generate an indicating signal responsive to a predetermined relationship between the row address from the refresh shadow counter and one of the addresses from the storage device.

11. The apparatus of claim 10, wherein the failing address comparator is operable to invert at least one of the bits of the row address received from the refresh shadow counter to provide a comparison row address, the failing address comparator further being operable to generate the indicating signal responsive to a match between the comparison row address and one of the stored row addresses.

12. The apparatus of claim 9, wherein the storage device comprises a non-volatile memory device located in the memory module.

13. The apparatus of claim 9, wherein the memory device in the memory module comprises a volatile memory device.

14. The apparatus of claim 13, wherein the volatile memory device comprises a dynamic random access memory device.

15. The apparatus of claim 9, wherein the memory control state machine is operable to output command signals adapted to cause the storage device to store the respective addresses corresponding to memory cells from which the erroneous read data was read.

16. A method of refreshing memory cells in a memory some of which may have relatively short data retention times, the method comprising:
receiving write data;
generating respective ECC syndrome bits corresponding to the received write data;
storing the write data in the memory cells;
storing the generated ECC syndrome bits;
reading data from the memory cells;
using the stored ECC syndrome bits to determine if the read data is erroneous;
storing the respective addresses corresponding to memory cells from which the erroneous read data was read;
generating addresses in a memory controller to be provided to the memory for refreshing rows of the memory cells, wherein the addresses are generated by a shadow refresh counter in the memory controller to shadow refresh addresses generated by a refresh counter in the memory;
providing the addresses from the memory controller to the memory to refresh the rows of the memory cells; and
using the stored addresses to refresh memory cells corresponding to the stored addresses more frequently than the rate at which other memory cells are refreshed.

17. The method of claim 16, further comprising:
sequentially refreshing memory cells corresponding to respective refresh addresses;
receiving addresses corresponding to memory cells from which the erroneous read data was read;
comparing the received addresses to the refresh addresses to determine if a predetermined relationship exists between any of the received addresses and the refresh addresses; and
in response to determining that the predetermined relationship exists, generating an indicating signal.

18. The method of claim 17, wherein the act of comparing the received addresses to the refresh addresses comprises:
inverting at least one of the bits of the refresh address to obtain a comparison address; and
generating the indicating signal responsive to a match between the comparison address and one of the received addresses.

19. The method of claim 16, wherein the act of storing the generated ECC syndrome bits comprises storing the generated ECC syndrome bits in the memory cells along with the stored write data.

\* \* \* \* \*